(12) United States Patent
Arsovski et al.

(10) Patent No.: US 7,898,286 B2
(45) Date of Patent: Mar. 1, 2011

(54) CRITICAL PATH REDUNDANT LOGIC FOR MITIGATION OF HARDWARE ACROSS CHIP VARIATION

(75) Inventors: Igor Arsovski, Williston, VT (US); Hayden C. Cranford, Jr., Cary, NC (US); Joseph A. Iadanza, Hinesburg, VT (US); Todd E. Leonard, Williston, VT (US); Jason M. Norman, Essex Junction, VT (US); Hemen R. Shah, South Burlington, VT (US); Sebastian T. Ventrone, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/369,066

(22) Filed: Feb. 11, 2009

(65) Prior Publication Data

US 2010/0201377 A1 Aug. 12, 2010

(51) Int. Cl.
*H03K 19/00* (2006.01)
(52) U.S. Cl. .................................. 326/16; 326/9; 326/14
(58) Field of Classification Search .............. 326/14–16
See application file for complete search history.

(56) References Cited

U.S. PATENT DOCUMENTS

| | | | |
|---|---|---|---|
| 3,708,686 A | 1/1973 | Butler et al. | |
| 4,831,725 A | 5/1989 | Dunham et al. | |
| 5,355,090 A | 10/1994 | Pajowski et al. | |
| 5,515,403 A | 5/1996 | Sloan et al. | |
| 5,973,978 A | 10/1999 | Cutter et al. | |
| 6,043,942 A | 3/2000 | Cunningham et al. | |
| 6,272,439 B1 | 8/2001 | Buer et al. | |
| 6,415,402 B2 | 7/2002 | Bishop et al. | |
| 6,823,470 B2 | 11/2004 | Smith et al. | |
| 2005/0258857 A1* | 11/2005 | Whetsel | 324/765 |
| 2009/0167337 A1* | 7/2009 | Yamane et al. | 324/763 |
| 2009/0212799 A1* | 8/2009 | de la Puente et al. | 324/754 |

OTHER PUBLICATIONS

Andreas Veneris, et al.; "Design Rewiring Using ATPG"; IEEE Transactions on Computer-Aided Design of Intergrated Circuits and Systems, vol. 21, No. 12, Dec. 2002; pp. 1469-1479.

* cited by examiner

*Primary Examiner*—Anh Q Tran
(74) *Attorney, Agent, or Firm*—David Cain; Roberts Mlotkowski Safran & Cole. P.C.

(57) ABSTRACT

Cross-die connection structure and method for a die or chip includes buffer elements having a buffer driver and bypass, and control lines coupled to the buffer elements in order to select one of the buffer driver and bypass for each respective buffer element. A logic network is arranged with the buffer elements to form functional paths, a test unit is structured and arranged to test the functional paths and to be coupled to the control lines, and a configuration storage register to set the selected one of the buffer driver and bypass for each passing functional path.

20 Claims, 7 Drawing Sheets

CRITICAL PATH REDUNDANT LOGIC FOR MITIGATION OF HARDWARE ACROSS CHIP VARIATION

FIELD OF THE INVENTION

The invention relates to integrated circuits, and more particularly to methods and devices for tuning parts of an integrated circuit for across chip variation, and in particular, to tune parts for best and worst case, or for some statistical process corner.

BACKGROUND

Current hardware contains cross-die variation, which affects the ability of critical path timings to be met on a part by part basis. The known process of tuning parts for best case and worst case, or even for some type of statistical variation, does not provide enough margin, or is not adequately responsive to across-wafer or across-die variation.

Today's designs synthesize logic from a high level description based upon a set of files called timing assertions. These timing assertions define the arrival time of each input signal on every sub-unit of a design, and the required delay time of each signal leaving a timing unit. Due to variation of process, temperature and voltage, a set of Process/Voltage/Temperature corners, known as "PVT," are selected to adequately verify the all units will meet the required timing assertions. Examples of PVTs would be Slow Process/1.0V/125C which would be selected to verify that the unit meets the worst case conditions. Another example would be Fast Process/1.2V/−55C for a test of meeting the fast spec requirements.

While this technique was adequate in older technologies such as 180 nm or older, new technologies such as 90 nm or less are beginning to show increasing effects of cross die variation due to the small geometry effects and the tolerance of building such devices within these advanced technologies. As such, designs must utilize increasingly conservative approaches to provide adequate guard band to account for variations. because, even if a portion of a design may be closer to worst case performance, another portion of the path may have performance margin due to this process variation. In a similar manner, one area of the chip die may exhibit worst case process effects, while another section, due to cross-chip variation, has performance margin. With today's design techniques, designs are timed to meet the worst case conditions and cross-die variation assumptions, resulting in over-designed paths being integrated into the silicon.

The disadvantage of these fixed logic designs/paths is that even when regional margin or even total chip margin exists (for hardware not at slow process) paths within the design are optimized for worst case PVT and across-die matching. As result, designs burn excessive AC power during active state, and also leak the most leakage power during standby.

SUMMARY

In aspects of the invention, a cross-die connection structure for a die or chip comprises buffer elements having a buffer driver and a bypass, and control lines coupled to the buffer elements in order to select one of the buffer driver and the bypass for each respective buffer element. A logic network is arranged with the buffer elements to form functional paths, a test unit is structured and arranged to test the functional paths and to be coupled to the control lines, and a configuration storage register to set the selected one of the buffer driver and bypass for each passing functional path.

In aspects of the invention, a method for start up for a die or chip, in which the die or chip has a logic network and buffer elements, comprises buffer drivers and bypasses, arranged across the die or chip in functional paths and control lines coupled to the buffer drivers and bypasses. The method comprises selecting a configuration of the buffer drivers and the bypasses for respective buffer elements for each functional path, applying a test sequence to the functional paths, determining whether the functional paths pass or fail, and storing the configuration of the buffer drivers and the bypasses for each passing functional path.

In aspects of the invention, a self-test die or chip structure comprises a logic network, buffer elements comprising a buffer driver and bypass, functional paths, comprising the logic network and the buffer elements, being arranged across the die or chip, and control lines coupled to select one of the buffer driver and bypass of respective buffer elements.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention is directed to a method and structure to switch between different circuit structures at test or run time to determine optimum power and performance for paths on a chip-by-chip basis. The invention utilizes a set of logic structures along with a method of test/selection of the logic structures both at test, during reset, and or during run time.

Figure 1:
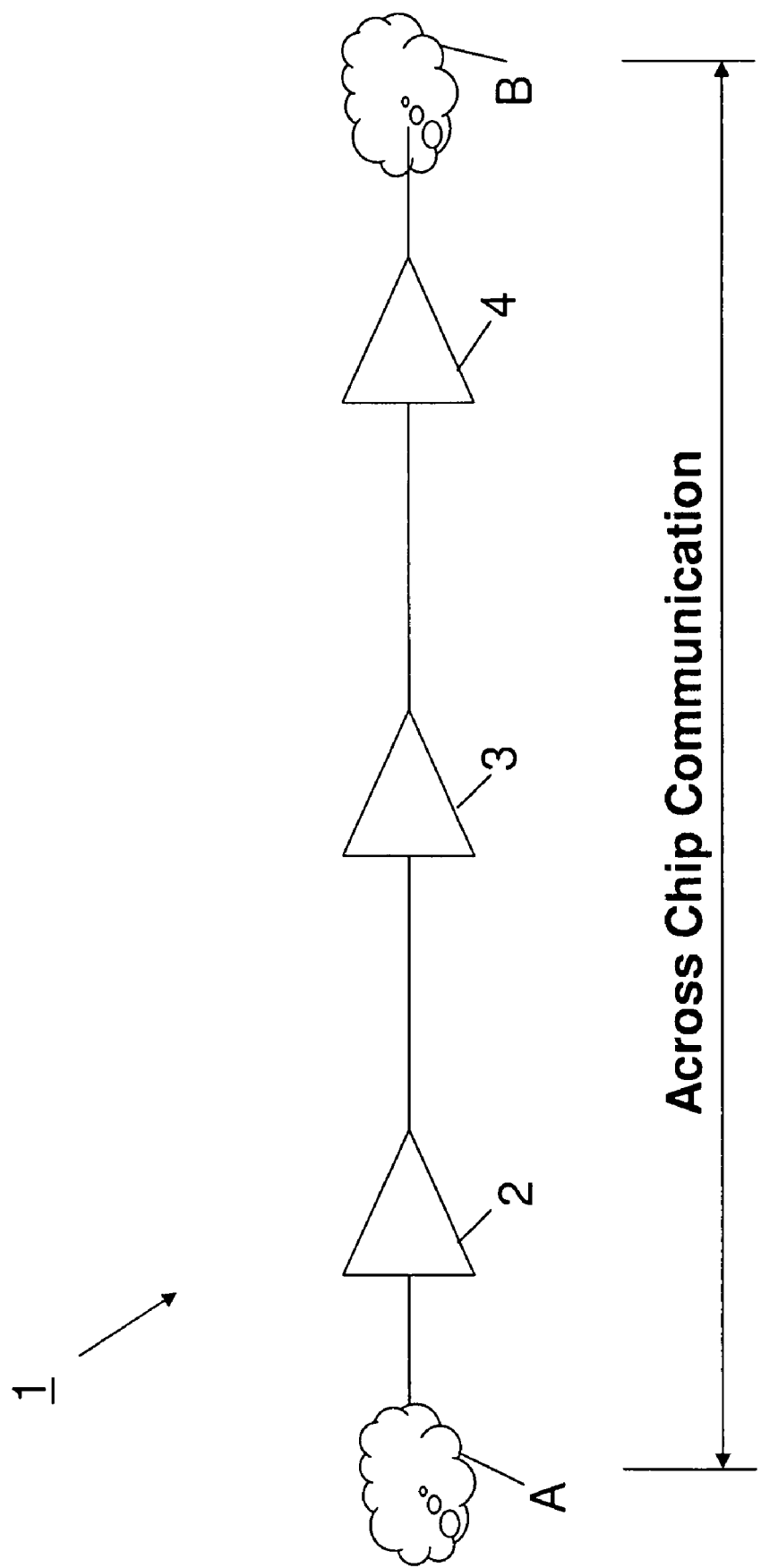
FIG. 1 illustrates an arrangement for buffering across chip variation.

FIG. 1 illustrates an arrangement for buffering an across-chip connection to minimize delay through a trace utilizing a fixed logic design/path. While it is known that hardware can vary across a chip or die, e.g., due to process, voltage, or temperature (PVT) variation, the fixed logic design is utilized for all paths to meet timing requirements for worst case conditions. A portion of a chip 1, e.g., an integrated circuit chip, is illustrated in FIG. 1. Reference A represents logic at a location A on a chip, and reference B represents logic at a location B on the chip. Locations A and B are arranged at opposite corners of chip 1. Buffers 2, 3, and 4 are arranged between locations A and B to compensate for worst case conditions in across chip communication.

However, when not located at the worst corner, buffers 2, 3, and 4 burn unnecessary power, particularly at the fast corner. Further, data arrival varies widely over different process corners driving constraints on setup and hold requirements. By way of example, Table 1 compares the timing margin on logical paths (latch to latch) with buffering in the path and with the buffers removed from the path. The table looks at 5 different paths in the 3 timing modes of Worse Case (WC), Best Case (BC) and Nominal (Nom). The guard band is the amount of time required between data and clock active edge arrival at the latch/flip flop in order to capture the data correctly. Margin is the amount of time in excess of the guard band that data arrives before the clock. The equation for determining the margin is:

Margin=Clock Arrival−Data Arrival−Guard band

For example, path 1 in WC mode would be 3.6−3.396−0.125=0.079. Thus, the data arrives 0.079 ns before the clock and the data could arrive 0.079 ns later while still allowing data to be captured correctly at the test point.

Table 1 below shows when the data arrives at the test point and how much margin the path has with no buffering in provided in the path, and when the data arrives at the test point and how much margin a path would have if the number of buffers were utilized in the path.

These paths were taken from an exemplary 90 nm IC design, prior to IC physical design and using a large-chip wireload model:
Cycle time is 3.6 ns;
WC vdd=1.05 temp=105;
Nom vdd=1.2 temp=55; and
BC vdd=1.3 temp=10.

Table 1 shows results with buffers in path and results without Buffers in Path, as follows:

Selective buffering across chip 10 with programmable buffer devices 14 can minimize delay through upper trace 11 by activating all buffers, and also minimize power and timing uncertainty by operating in a pass gate mode, i.e., all buffers in a pass mode, through lower trace 13. In middle trace 12, at least one of the buffers can be in active mode, while at least one of the buffers can be in pass mode. Further, the vertical lines extending from programmable buffer devices 14 are control lines, and can be activated through, e.g., control bits, to independently control each programmable buffer device 14. Thus, depending on the process corner that the chip lands in, the control bits can be set to program the relevant path.

Figure 2:
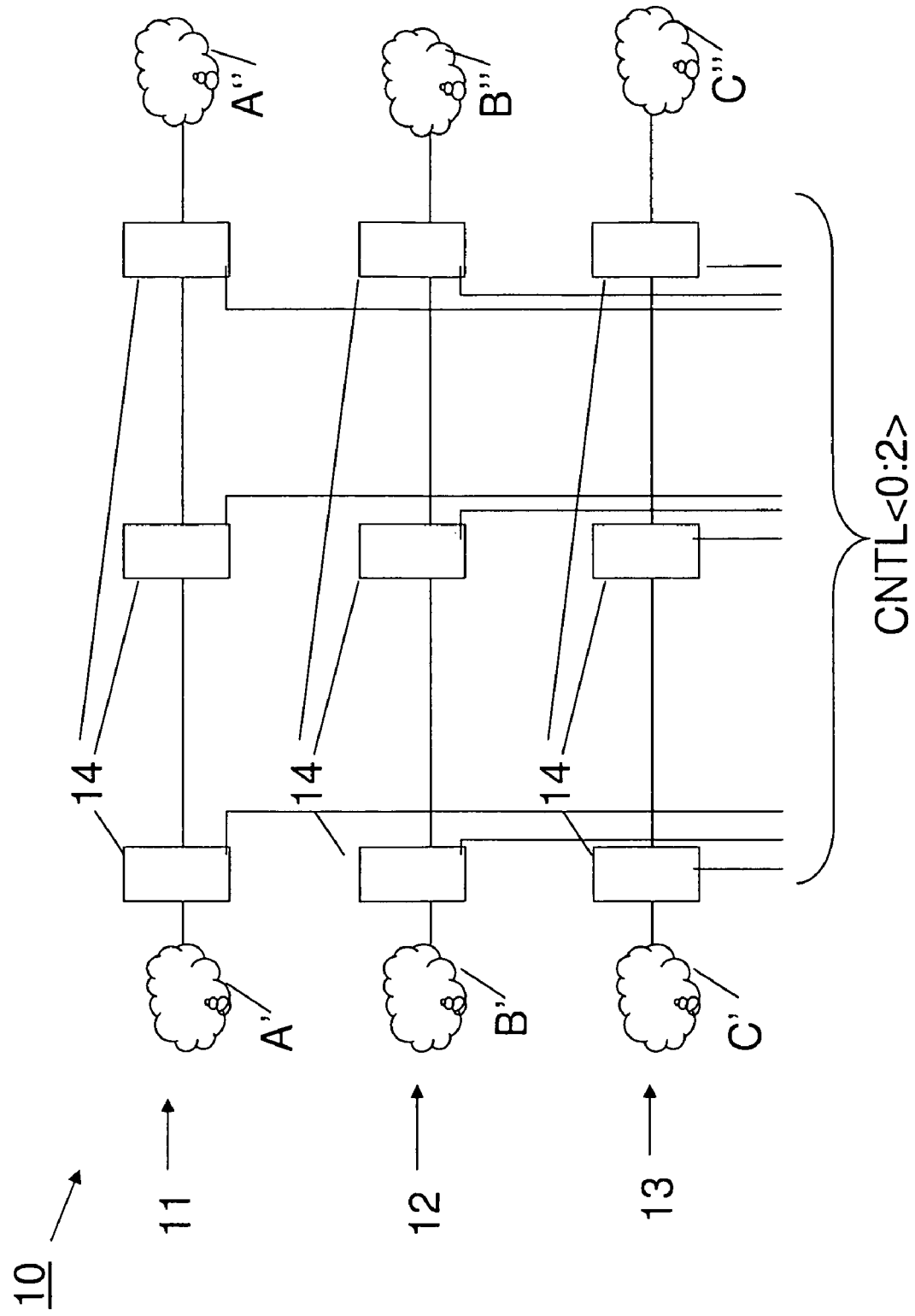
FIG. 2 illustrates an arrangement according to the invention for selectively buffering across chip variation.
Figure 3:
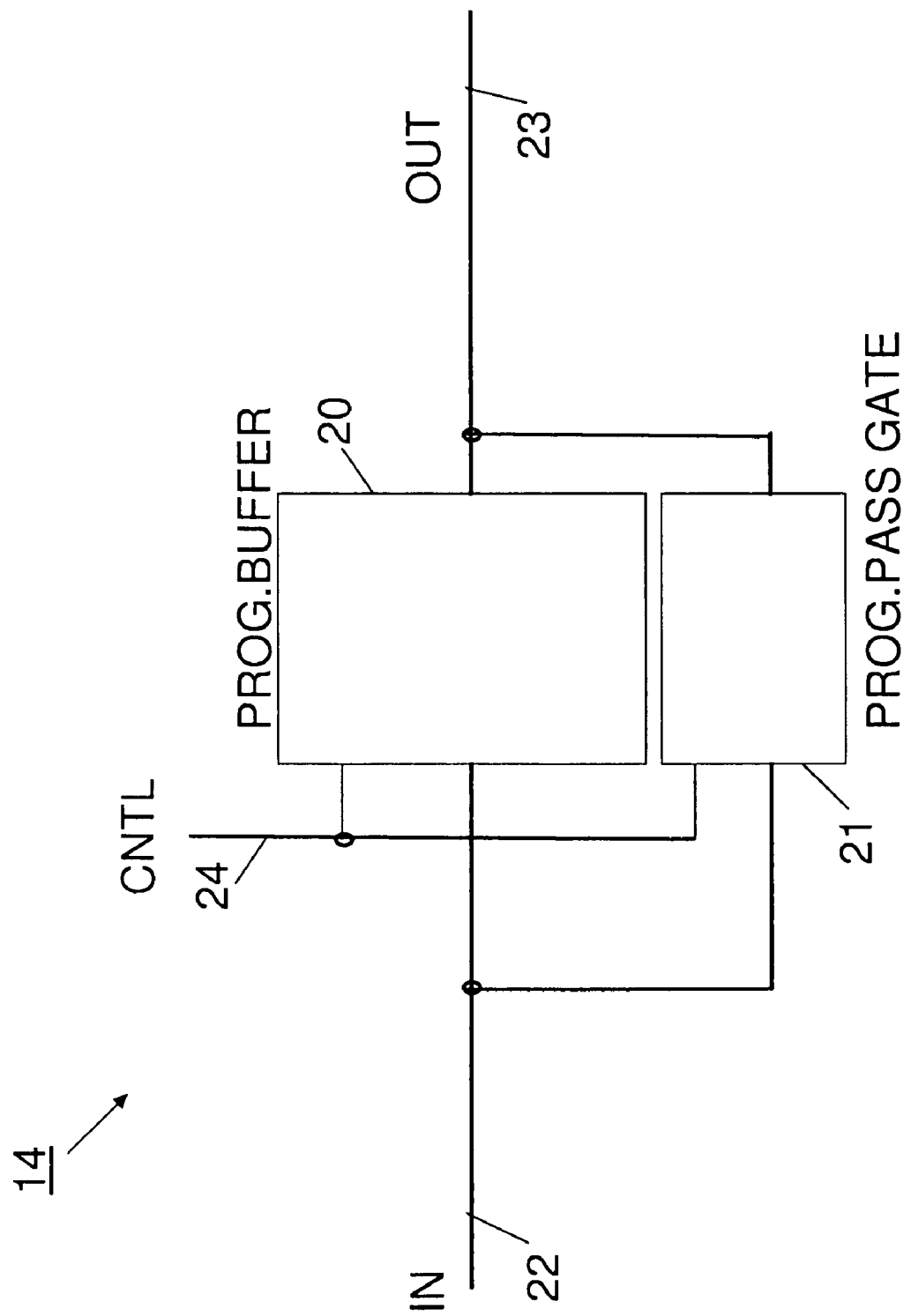
FIG. 3 shows an exemplary block illustration of the programmable buffer device depicted in FIG. 2 in accordance with the invention.

FIG. 3 shows an exemplary block illustration of programmable buffer device 14 depicted in FIG. 2, which includes programmable buffer 20 and programmable pass gate (bypass) 21. An input signal is applied to both programmable buffer 20 and programmable pass gate 21 on line 22, while an output signal is output from both programmable buffer 20 and programmable pass gate 21 on line 23. Control line 24 is arranged to selectively activate one of programmable buffer 20 and programmable pass gate 21 between the input and output.

Figure 4:
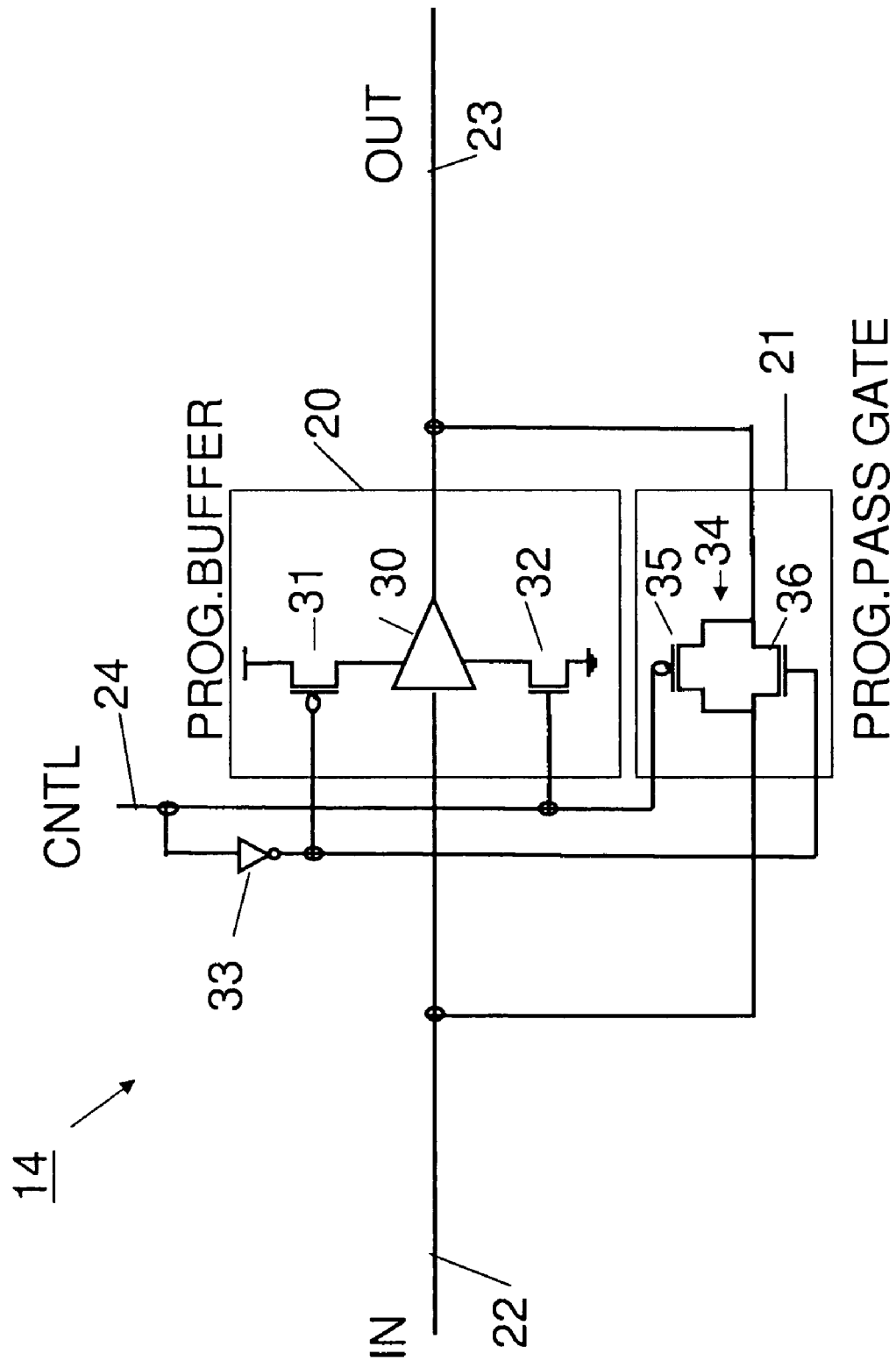
FIG. 4 shows a more detailed view of the buffer device depicted in FIGS. 2 and 3 in accordance with the invention.

FIG. 4 shows a more detailed view of buffer device 14 depicted in FIGS. 2 and 3, which can be logic structures composed of a set of buffer drivers and bypass circuits, and/or a set of selectable finger circuits, and/or set of equivalent circuits. In the exemplary illustration of FIG. 4, programmable buffer 20 can be formed by a buffer driver 30 connected between input 22 and output 23. Further, a switch 31, e.g., a MOSFET (header cell), is coupled between a source, e.g.,

TABLE 1

| path | Timing Mode | Guard band at capture point (ns) | Data Arrival at capture point(ns) | Margin(ns) Without Buffers | Buffers in Path | Data Arrival at capture point(ns) | Margin(ns) With Buffers |
| --- | --- | --- | --- | --- | --- | --- | --- |
| 1 | WC | 0.125 | 3.396 | 0.079 | 3 | 4.280 | −0.804 |
| 1 | Nom | 0.080 | 2.125 | 1.395 | 3 | 2.719 | 0.801 |
| 1 | BC | 0.059 | 1.185 | 2.356 | 3 | 1.225 | 2.316 |
| 2 | WC | 0.143 | 3.225 | 0.232 | 2 | 9.246 | −5.789 |
| 2 | Nom | 0.091 | 1.949 | 1.560 | 2 | 6.060 | −2.551 |
| 2 | BC | 0.059 | 0.974 | 2.567 | 2 | 1.282 | 2.259 |
| 3 | WC | 0.125 | 3.205 | 0.270 | 4 | 3.411 | 0.064 |
| 3 | Nom | 0.080 | 1.938 | 1.581 | 4 | 2.081 | 1.502 |
| 3 | BC | 0.059 | 0.871 | 2.670 | 4 | 1.075 | 2.665 |
| 4 | WC | 0.143 | 3.185 | 0.272 | 2 | 11.47 | −8.020 |
| 4 | Nom | 0.081 | 1.943 | 1.566 | 2 | 7.41 | −3.090 |
| 4 | BC | 0.059 | 1.001 | 2.540 | 2 | 1.388 | 2.153 |
| 5 | WC | 0.125 | 3.179 | 0.296 | 6 | 6.951 | −3.476 |
| 5 | Nom | 0.080 | 1.938 | 1.582 | 6 | 4.371 | −0.851 |
| 5 | BC | 0.059 | 1.000 | 2.541 | 6 | 1.182 | 2.359 |

Thus, it would be advantageous to be able to selectively activate only the buffers necessary to achieve the desired timing requirements for PVT variation for each critical path on the chip. FIG. 2 illustrates an exemplary portion of a chip 10, such as an integrated circuit. An upper trace or path 11 can be, e.g., a slow corner, that extends from a chip location A' to A", a middle trace or path 12 can be, e.g., a nominal corner, that extends from a chip location B' to B", and a lower trace or path 13 can be, e.g., a fast corner, that extends from a chip location C' to C". Further, between the noted chip locations is a matrix composed of programmable buffers 14. While FIG. 2 shows three programmable buffer devices 14 between the chip locations, it is noted that this number is merely for purposes of ease of illustration and explanation, and that any number of programmable buffer devices can be used with the invention.

Vdd, and buffer driver 30. The gate of switch 31 is an inverted input connected to control line 24 through inverter 33. A switch 32, e.g., a MOSFET (footer cell), is coupled between buffer driver 30 and ground. The gate of switch 32 is connected to control line 24. The header and footer cells isolate the buffer (in pass or bypass mode) to prevent leakage and can turn off buffer 30 when not selected. Programmable pass gate 21 may be formed by a switch 34 having a first MOSFET 35 and a second complimentary MOSFET 36. First MOSFET 35 is connected to second MOSFET 36 in parallel. The gate of first MOSFET 35 has an inverted input connected to control line 24 and the gate of second MOSFET 36 is connected to control line 24 through inverter 33.

Thus, when an appropriate control signal is applied on control line 24, either buffer driver 30 or switch 34 is activated, thereby placing programmable buffer device 14 in either a buffer or pass mode.

Figure 5:
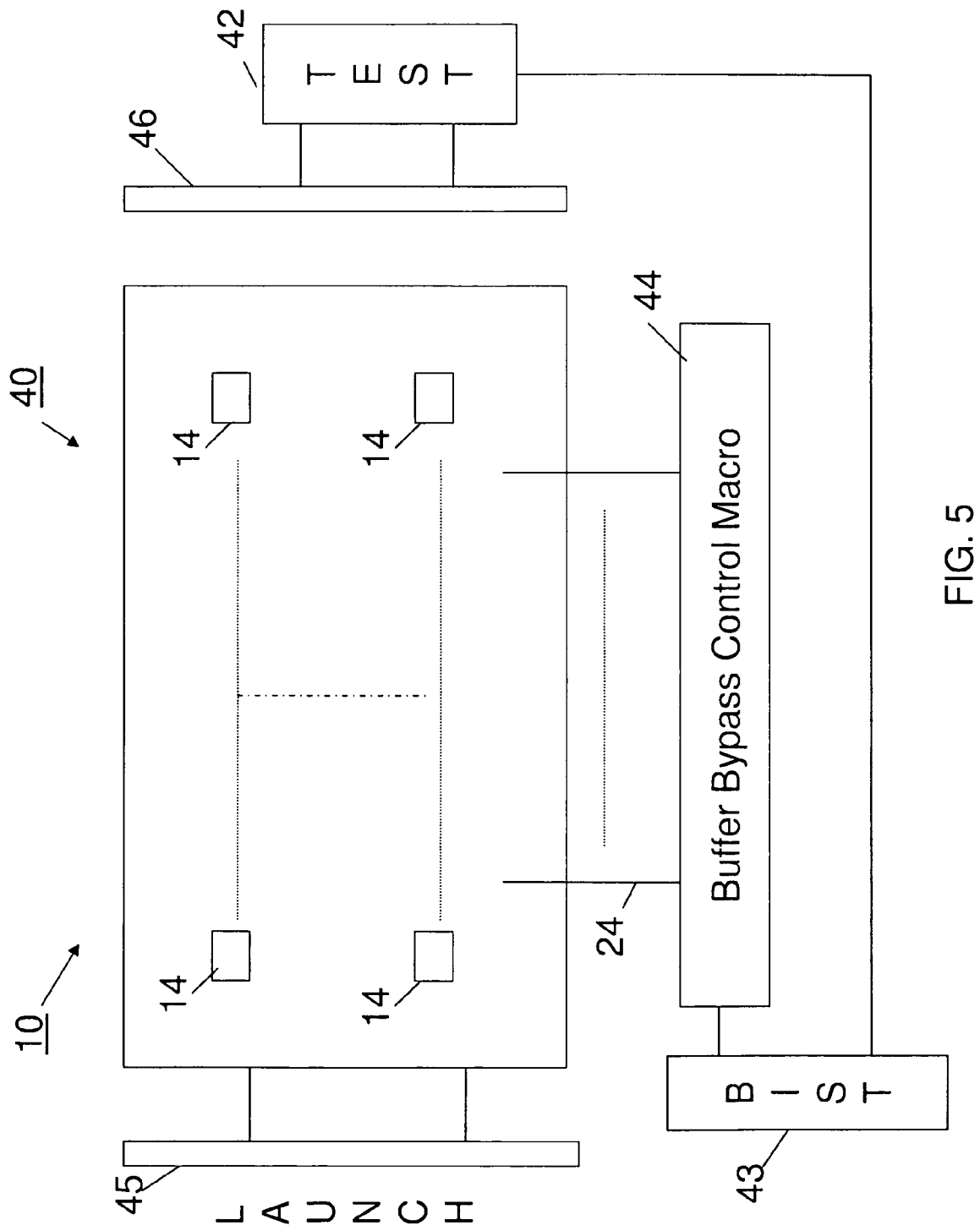
FIG. 5 shows an exemplary block illustration of a chip according to the invention.

FIG. 5 illustrates an exemplary test set 40 structured to test buffer/logic 41 on the die or chip 10. Chip 10 can include logic and the programmable buffer devices coupled between structures to launch data 45 into the logic and programmable buffer devices in accordance with hardware test structure 42 and to capture data 46 at the output(s) of the logic and programmable devices and compare the capture results to expected data. In the exemplary embodiment, test structure 42 can be part of or is integrated in or on the chip, but it is understood that those ordinarily skilled in the art can arrange test structures off the chip that are coupleable to the chip to test for failing latches in order to determine which latches to set without departing from the spirit and scope of the embodiments of the invention. Test set 40 operates to determine the minimum number of buffer devices which may be activated while maintaining functionality of logic/path(s). Of course, other test structures can also be utilized without departing from the spirit and scope of the invention. By way of example, test structure 42 can also be a built-in self test (BIST) structure and/or programmable clock trees, a jtag or LSSD scan out function, and/or local fail detect, and/or miser/failure detect circuit.

During design cycle, a cutoff design margin point can be picked for a set of paths to be added to a Redundant Logic Path set. These can generally be the slowest group of paths on the design, and the synthesis tool can categorize the critical paths as either complex logic cones or simple across-chip buffering paths.

The present invention can be utilized in paths categorized as simple across chip buffer type paths, i.e., paths within the cutoff design margin. In the non-bypass mode of programmable buffer device 14, the signal is re-driven by buffer driver 30 (FIG. 4) for maximum performance at that portion of the logic path, and in bypass mode of programmable buffer device 14, the signal will route around buffer driver 30, i.e., through pass gate 31 (FIG. 4), for a lower performance and lower power operation. The cutoff set of paths would tend to be the longer paths and would typically utilize a number of these bypass buffers on the same die. Also, across-chip signal paths are typically within this group which as described would be susceptible to this across-chip variation.

A controller 43, e.g., a BIST controller, can be coupled between a buffer bypass control macro 44 and test structure 42, and control lines 24 of die or chip 10 are connected to buffer bypass control macro 44 so that, via controller 43, buffers driver 30 or pass gate switch 31 may be selectively accessed as across chip communication is tested (FIG. 4).

During reset, a set of BIST functions, e.g. a random or pseudorandom sequence, in test structure 42 can initiate a sequence of tests to exercise the programmable buffer devices 14 in the designated traces. The sequence of tests monitors performance of the traces as the set of BIST functions cycle through the traces in a serial or parallel manner. A clock control design can reduce the timing margin and upon completion of each test sequence, can verify if the design is within the timing margin. In embodiments, buffer bypass control macro 44 under control of controller 43 can initially set all programmable buffer devices into pass mode. Thus, upon the initial startup, all of the selected paths would be at their minimum power and maximum delay function. Across chip communication can be tested via test structure 42 without buffers to determine whether any latches fail.

For latches that pass, the traces are in full pass mode, i.e., no buffers between the latches. For latches that fail, buffer bypass control macro can selectively change a first programmable buffer device 14 from pass mode to buffer, and the latches can be retested. If the latches fail again, a next programmable buffer device is changed from pass mode to buffer and retested. By way of example, the programmable buffer devices 14 can be cumulatively increased each time a latch failure is determined. Once the latch passes, the number of buffers needed in each trace is determined.

In addition to, or alternatively, after a failure is determined, a decision matrix provided in, e.g., controller 43, can be run to select which programmable buffer device 14 to switch into buffer mode. However, because of the across chip variation, the selection of programmable buffer device 14 may not simply be a case of picking the least-gain circuit and working up. Instead, during synthesis, a table of book types and a bypass map can be stored within a set of ROM structures. A selection sequence for switching pass gates 31 of programmable buffer devices 14 to buffer drivers 30 can be executed. As each new pass gate 31 is switched to buffer driver 30, the test is rerun to verify a performance pass/fail of the trace at issue. The timing path is always guaranteed to pass if the entire design is at worst case, since the performance is always closed for a worst case timing check. Moreover, once a passing condition has been reached, the set of pass gates are locked in a set of latches so that the paths remain locked until either a power on reset or a power off/on cycle occurs.

As the chip warms up, the design may continue to have paths slow down. To ensure enough timing margin, the original test condition will have some built in margin to allow for the temperature effect of the design.

Also, built into the design, may be periodic AC testing to change the selection of the bypass set of signals. The same repeating isolation, and bypass selection means is used.

Using the built-in test mechanism, the minimum number of higher-power circuits are selected for the whole set of paths included in the performance cutoff criteria. The resulting design guarantees the minimum number of higher power buffers on a chip by chip basis.

The flow diagrams described herein may be implemented in computer infrastructure environments to provide instructions for testing the chip or die. The flow diagrams may represent a high-level block diagram of the invention. The steps of the flow diagrams may be implemented and executed from either a server, in a client server relationship, or they may run on a user workstation with operative information conveyed to the user workstation. The steps of FIGS. 6 and 7 may be implemented on computer program code in combination with the appropriate hardware. This computer program code may be stored on storage media such as a diskette, hard disk, CD-ROM, DVD-ROM or tape, as well as a memory storage device or collection of memory storage devices such as read-only memory (ROM) or random access memory (RAM). Additionally, the computer program code can be transferred to a workstation over the Internet or some other type of network.

Figure 6:
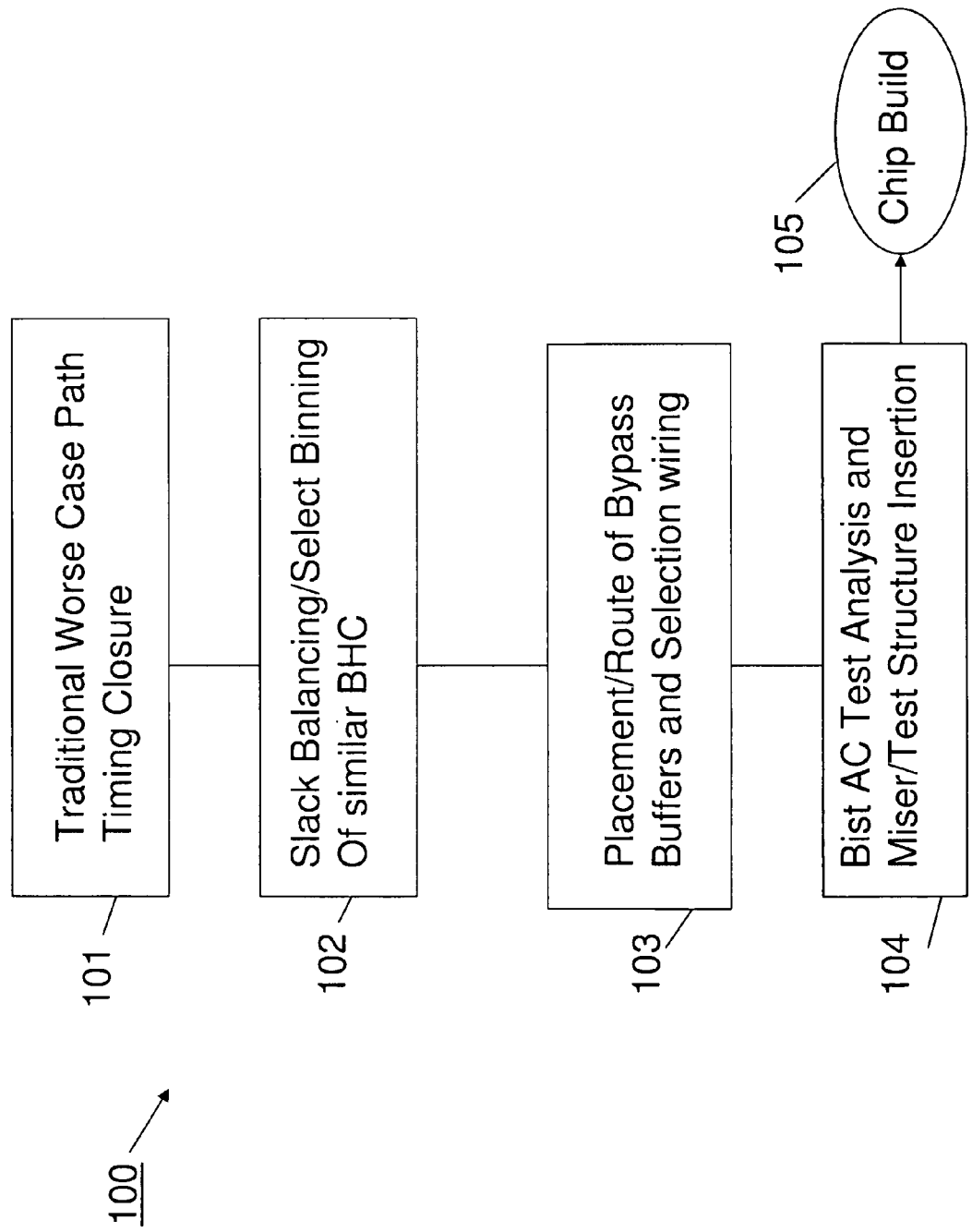
FIG. 6 illustrates an exemplary flow diagram for chip design in accordance with the invention.

By way of non-limiting example, FIG. 6 illustrates a flow diagram 100 of a design phase of a chip or die according to an aspect of the invention. By way of non-limiting example, a traditional worst case path timing closure can be determined in any suitable conventional manner at step 101. At step 102, slack balancing or select binning of similar block hardware code (BHC), which can define the drive strength of an individual buffer, can be determined in any suitable conventional manner. A placement/route of bypass buffers and selection wiring is added to the design at step 103. At step 104, a BIST AC test analysis is performed and a miser/test structure insertion is provided to the design. Thereafter, a chip build is performed at step 105.

Figure 7:
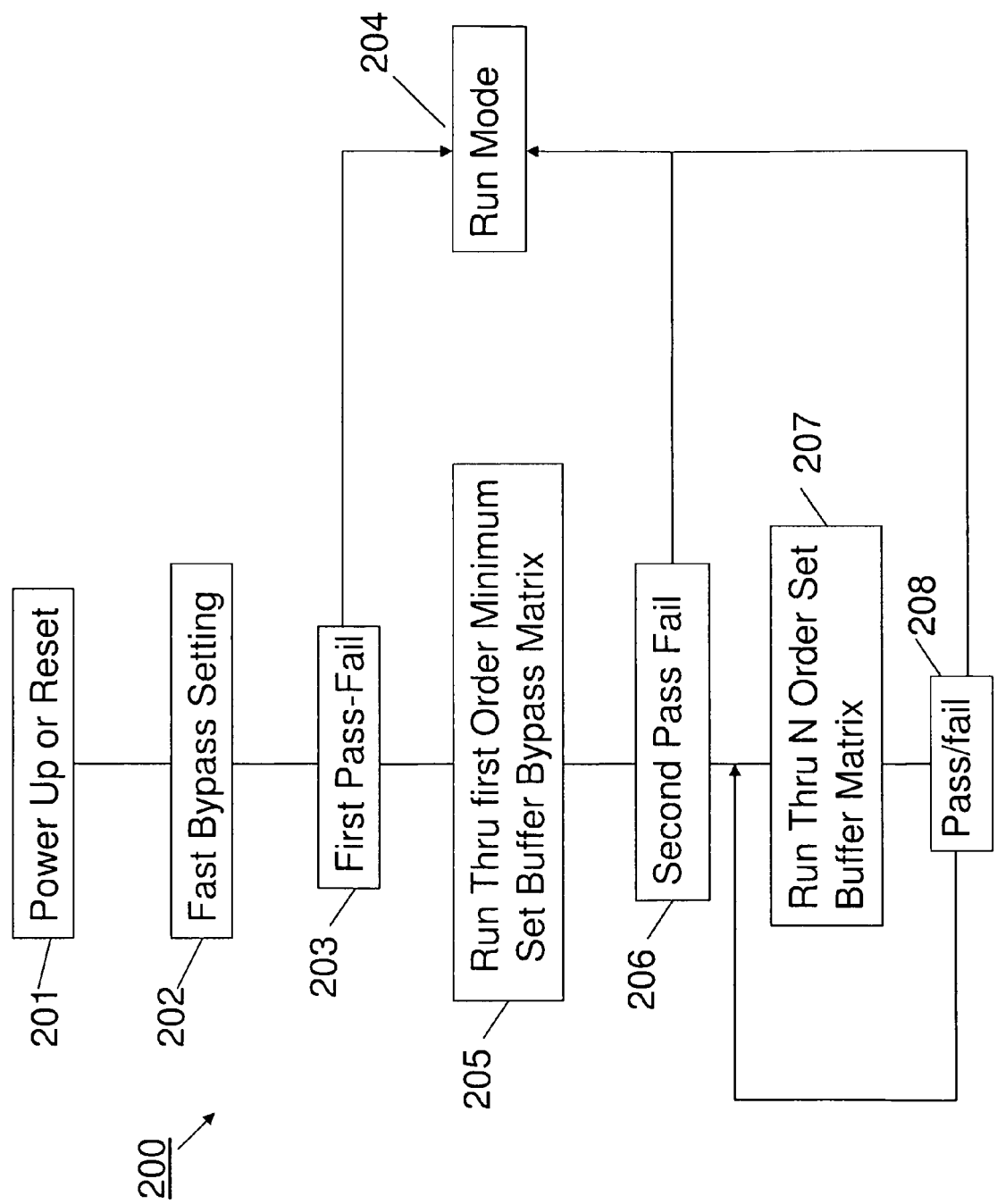
FIG. 7 illustrates an exemplary flow diagram for setting the buffers in accordance with the invention.

FIG. 7 illustrates an exemplary flow diagram 200 of a run time or test time procedure for determining the appropriate buffers to activate on each critical path to be tested. During a power up or reset at step 201, the chip or die is analyzed to establish the appropriate settings for timing margin on the critical paths. At step 202, the programmable buffer devices are initially set into pass mode, i.e., none of the buffers are active. At step 203, a first pass/fail of the critical paths is performed. As discussed above, a set of BIST functions are run to determine whether the paths are within a desired timing margin. If all paths pass, the procedure proceeds to run mode at step 204.

If all paths do not pass, i.e., if any paths fail, buffers are selected in the failed paths at step 205. As described above, the first of the buffers along the trace can be activated or a first order of a buffer bypass matrix can be run. After the buffers are set, a second pass/fail test is run at step 206. If all paths pass, the procedure proceeds to run mode at step 204. If all paths do not pass, additional buffers are selected in the failed paths at step 207. Again, as described above, a next buffer along the trace can be activated, such that the buffers cumulatively increase in number after each failure, or a next order of the buffer bypass matrix can be run to determine which buffers to be activated. Once set, another pass/fail test is run at step 208. If all paths pass, the procedure proceeds to run mode at step 204. If all paths do not pass, the process returns to step 207 to select additional buffers.

It is noted that the instant invention is applicable in both within die and intra die arrangements.

The invention can take the form of an entirely hardware embodiment or an embodiment containing both hardware and software elements. The hardware and software elements include a computer infrastructure configured to implement the functionality of the present invention. The software elements may be firmware, resident software, microcode, etc. Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed:

1. A cross-die connection structure for a die or chip comprising:

buffer elements comprising a buffer driver and bypass;

control lines coupled to the buffer elements in order to select one of the buffer driver and bypass for each respective buffer element;

a logic network arranged with the buffer elements to form functional paths;

a test unit structured and arranged to test the functional paths and to be coupled to the control lines; and a configuration storage register to set the selected one of the buffer driver and bypass for each passing functional path.

2. The cross die connection structure in accordance with claim 1, wherein the test unit is an integrated test macro to launch a test sequence to the functional paths.

3. The cross die connection structure in accordance with claim 2, wherein the test unit comprises a controller to control a selection of the one of the buffer driver and bypass for each respective buffer element in the functional paths, and a results capture compare unit arranged to determine whether the functional paths pass or fail as a result of the test sequence.

4. The cross-die connection structure in accordance with claim 1, wherein the buffer driver comprises a header cell and a footer cell to isolate the buffer drivers in order to prevent leakage, and a pass gate.

5. The cross-die connection structure in accordance with claim 1, wherein the test unit comprises a built in self test (BIST) macro.

6. A method for start up for a die or chip, the die or chip having a logic network and buffer elements comprising buffer drivers and bypasses arranged across the die or chip in functional paths, and control lines coupled to the buffer drivers and bypasses, the method comprising:

selecting a configuration of the buffer drivers and the bypasses for respective buffer elements for each functional path;

applying a test sequence to the functional paths;

determining whether the functional paths pass or fail; and storing the configuration of the buffer drivers and the bypasses for each passing functional path.

7. The method in accordance with claim 6, wherein before applying a first test sequence, the selecting a configuration comprises selecting all the bypasses on each functional path.

8. The method in accordance with claim 7, wherein, for each functional path determined to have failed, the selecting a configuration comprises selecting a first buffer driver on the failed functional path, and the method further comprises retesting the functional paths.

9. The method in accordance with claim 6, further comprising isolating the buffer driver to prevent leakage when the bypass is selected to turn off the buffer driver.

10. The method in accordance with claim 6, wherein the selecting a configuration comprises sequentially running BIST macros, and wherein the BIST macros set the buffer elements of each path to a maximum bypass for a first test sequence, and, for each successive test sequence, the BIST macros select increasing numbers of the buffer devices for each failing functional path.

11. The method in accordance with claim 6, wherein the test sequence begins at power up.

12. The method in accordance with claim 6, further comprising, in a run mode, configuring the buffer drivers and bypasses for each buffer element in each path according to the stored configuration of the buffer drivers and bypasses.

13. A self-test die or chip structure, comprising:
a logic network;
buffer elements comprising a buffer driver and bypass;
paths, comprising the logic network and the buffer elements, being arranged across the die or chip; and
control lines coupled to each buffer element of the buffer elements, wherein each of the control lines is coupled to the buffer driver and bypass of respective buffer elements and is operable to select one of the buffer driver and bypass of respective buffer elements.

14. A self-test die or chip structure, comprising:
a logic network;
buffer elements comprising a buffer driver and bypass;
paths, comprising the logic network and the buffer elements, being arranged across the die or chip;
control lines coupled to select one of the buffer driver and bypass of respective buffer elements;
a test launch device to apply a test signal to the paths; and
a timing device structured and arranged to determine a timing margin for each path.

15. The self-test die or chip structure in accordance with claim 13, further comprising a controller to control, via the control lines, a number of buffer drivers selected for testing each path.

16. The self-test die or chip structure in accordance with claim 15, wherein, for an initial test signal, the controller selects all bypasses for each path.

17. A self-test die or chip structure, comprising:
a logic network;
buffer elements comprising a buffer driver and bypass;
paths, comprising the logic network and the buffer elements, being arranged across the die or chip;
control lines coupled to select one of the buffer driver and bypass of respective buffer elements; and
a controller to control, via the control lines, a number of buffer drivers selected for testing each path,
wherein, for an initial test signal, the controller selects all bypasses for each path, and
for each path not within a predetermined timing margin, the controller increases the number of buffer drivers selected.

18. A self-test die or chip structure, comprising:
a logic network;
buffer elements comprising a buffer driver and bypass;
paths, comprising the logic network and the buffer elements, being arranged across the die or chip;
control lines coupled to select one of the buffer driver and bypass of respective buffer elements; and
a storage device for storing a configuration of the buffer drivers and the bypasses for each path.

19. The self-test die or chip structure in accordance with claim 18, wherein the stored configurations in the storage device are accessible when the die or chip is in a run mode.

20. The self-test die or chip structure in accordance with claim 13, wherein the buffer drivers comprise header cells and footer cells to isolate the buffer drivers to prevent leakage.

* * * * *